(12) United States Patent
Park et al.

(10) Patent No.: US 7,910,481 B2
(45) Date of Patent: Mar. 22, 2011

(54) METHOD FOR FABRICATING SEMICONDUCTOR DEVICE

(75) Inventors: Sang-Soo Park, Gyeonggi-do (KR); Seung-In Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/640,812

(22) Filed: Dec. 17, 2009

(65) Prior Publication Data
US 2010/0297845 A1 Nov. 25, 2010

(30) Foreign Application Priority Data
May 22, 2009 (KR) .................. 10-2009-0044884

(51) Int. Cl.
*H01L 21/44* (2006.01)
(52) U.S. Cl. ........ 438/672; 438/647; 438/684; 438/714; 438/719; 438/734
(58) Field of Classification Search .................. 438/618, 438/647, 672, 684, 710, 714, 719, 734
See application file for complete search history.

(56) References Cited

U.S. PATENT DOCUMENTS

| | | | | |
|---|---|---|---|---|
| 6,225,220 B1 * | 5/2001 | Chi et al. | ....................... | 438/672 |
| 6,239,022 B1 * | 5/2001 | Seo et al. | ....................... | 438/629 |
| 6,255,226 B1 * | 7/2001 | Zheng et al. | .................. | 438/734 |
| 6,593,242 B2 * | 7/2003 | Morgenstern | .................. | 438/700 |
| 2004/0152331 A1 * | 8/2004 | Xu et al. | ......................... | 438/719 |
| 2007/0224828 A1 * | 9/2007 | Kushibiki et al. | ............. | 438/706 |

FOREIGN PATENT DOCUMENTS

| | | |
|---|---|---|
| JP | 2001-274238 | 10/2001 |
| JP | 2006-190945 | 7/2006 |
| KR | 1020020002583 | 1/2002 |

OTHER PUBLICATIONS

Notice of Allowance issued from Korean Intellectual Property Office on Dec. 16, 2010.

* cited by examiner

*Primary Examiner* — Charles D Garber
*Assistant Examiner* — Bryan R Junge
(74) *Attorney, Agent, or Firm* — IP & T Group LLP

(57) ABSTRACT

A method for fabricating a semiconductor device includes forming an interlayer dielectric layer having a plurality of contact holes over a substrate, forming a conductive layer by filling the contact holes to cover the interlayer dielectric layer, performing a first main etch process to partially etch the conductive layer to form a first conductive layer, performing a second main etch process to etch the first conductive layer using an etch gas having a slower etch rate with respect to the first conductive layer than an etch gas used in the first main etch process until an upper surface of the interlayer dielectric layer is exposed to form a second conductive layer, and performing an over-etch process to etch a certain portion of the second conductive layer, and at the same time, to etch a certain portion of the interlayer dielectric layer to form a landing plug.

24 Claims, 4 Drawing Sheets

BREAKTHROUGH PROCESS (ISOTROPIC ETCH PROCESS, $SF_6$/He)

A FIRST MAIN ETCH PROCESS (ANISOTROPIC ETCH PROCESS, $Cl_2$)

A SECOND MAIN ETCH PROCESS (ANISOTROPIC ETCH PROCESS, $C_2F_6$)

OVER-ETCH PROCESS (ANISOTROPIC ETCH PROCESS, $C_2F_6$)

ated ClaimPriority
METHOD FOR FABRICATING SEMICONDUCTOR DEVICE

CROSS-REFERENCE TO RELATED APPLICATION

The present application claims priority of Korean Patent Application No. 10-2009-0044884, filed on May 22, 2009, which is incorporated herein by reference in its entirety.

BACKGROUND OF THE INVENTION

Exemplary embodiments of the present invention relate to a method for fabricating a semiconductor device, and more particularly, to a method for fabricating a landing plug of the semiconductor device.

As an integration rate of a semiconductor memory device has been increased, a distance between gates has been decreased. Since an area occupying a contact hole has been reduced clue to the reduced distance between the gates, a process margin of the contact hole has been decreased. Technology to secure an improved process margin of the contact hole has been developed, and generally, a landing plug contact (LPC) process is used. The landing plug contact (LPC) process secures an overlay margin for a subsequent contact plug forming process by filling a space between gates to be formed, a bit line contact, and a storage node contact.

FIGS. 1A and 1B are cross-sectional views illustrating a method for fabricating a landing plug contact (LPC) of the conventional semiconductor device.

Referring to FIG. 1A, a plurality of gate patterns 12 are formed over a substrate 11. Then, a gate spacer 13 is formed on both sidewalls of the gate patterns 12.

Subsequently, an oxide layer (not illustrated) is formed as an interlayer dielectric layer 14 to cover an upper surface of the substrate 11. A photoresist pattern (not illustrated) is formed over the interlayer dielectric layer 14. A plurality of contact holes 15 are formed by etching the interlayer dielectric layer 14 using the photoresist pattern as an etch barrier layer.

Referring to FIG. 1B, an etch back process is performed on a conductive layer 16 for the landing plug contact (LPC) until an upper surface of the interlayer dielectric layer 14 is exposed, thereby forming a landing plug 16A.

However, since the conventional etch-back process for forming the landing plug 16A is performed using an anisotropic etch, a height difference between upper portions of the conductive layer 16 yields a height difference between upper portions of the landing plug 16A.

Furthermore, since a chlorine (Cl$_2$) gas, having an etch rate with respect to a poly-silicon layer for the landing plug 16A greater than that with respect to an oxide layer for the interlayer dielectric layer 14, is used in an etch-back process, there is concern that the height difference between the upper portions of the landing plug 16A is becoming even larger.

The height difference between the upper portions of the landing plug 16A makes it difficult to control an etch amount and deposition thickness during a subsequent deposition process for forming a storage node contact plug and a bit line contact plug thereby decreasing a yield of the semiconductor memory device.

SUMMARY OF THE INVENTION

An embodiment of the present invention is directed to providing a method for fabricating a semiconductor memory device, which can minimize a height difference between upper portions of adjacent landing plugs by isolating adjacent landing plugs through an etch-back process, including a breakthrough process, a first main etch process, a second main etch process, and an over-etch process.

In accordance with an embodiment of the present invention, a method for fabricating a capacitor includes: forming an interlayer dielectric layer having a plurality of contact holes over a substrate, forming a conductive layer by filling the contact holes to cover the interlayer dielectric layer, performing a first main etch process to partially etch the conductive layer to form a first conductive layer, performing a second main etch process to etch the first conductive layer using an etch gas having a slower etch rate with respect to the first conductive layer than an etch gas used in the first main etch process until an upper surface of the interlayer dielectric layer is exposed to form a second conductive layer, and performing an over-etch process to etch a certain portion of the second conductive layer, and at the same time, to etch a certain portion of the interlayer dielectric layer to form a landing plug.

The method may further include performing a breakthrough process to partially etch the conductive layer to remove remains over the conductive layer before the performing of the first main etch process.

The breakthrough process, the first and the second main etch processes, and the over-etch process may be performed in-situ in the same chamber.

The breakthrough process may be performed using an isotropic etch process, and the first and the second main etch processes and the over-etch process are performed using an anisotropic etch process.

The breakthrough process may be performed at a pressure greater than a pressure used in the first and the second main etch processes and the over-etch process.

The first and the second main etch processes and the over-etch process may be performed under the pressure in a range of approximately 1 mTorr to approximately 7 mTorr.

The breakthrough process may be performed under the pressure in a range of approximately 8 mTorr to approximately 12 mTorr.

The breakthrough process may be performed using a source power smaller than a source power used in the first and the second main etch processes and the over-etch process.

The first and the second main etch processes and the over-etch process are performed using the source power in a range of approximately 800 W to approximately 900 W.

The breakthrough process may be performed using the source power in a range of approximately 350 W to approximately 450 W.

The breakthrough process is performed using a bias power smaller than a bias power used in the first main etch process, and the second main etch process and the over-etch process are performed using a bias power greater than a bias power used in the first main etch process.

The breakthrough process may be performed using the bias power in a range of approximately 0 W to approximately 10 W.

The first main etch process may be performed using the bias power in a range of approximately 75 W to approximately 95 W.

The second main etch process and the over-etch process may be performed using the bias power in a range of approximately 100 W to approximately 120 W.

The breakthrough process may be performed under a pressure in a range of approximately 8 mTorr to approximately 12 mTorr, using a source power in a range of approximately 350

W to approximately 450 W, and using a bias power in range of approximately 0 W to approximately 10 W.

The first main etch process may be performed under a pressure in a range of approximately 1 mTorr to approximately 7 mTorr, using a source power in a range of approximately 800 W to approximately 900 W, and using a bias power in a range of approximately 75 W to approximately 95 W.

The second main etch process and the over-etch process may be performed under a pressure in a range of approximately 1 mTorr to approximately 7 mTorr, using a source power in a range of approximately 800 W to approximately 900 W, and using a bias power in a range of approximately 100 W to approximately 120 W.

The interlayer dielectric layer may include an oxide layer, and the second conductive layer may include a silicon layer.

The breakthrough process may be performed using a mixed gas of a sulfur hexafluoride ($SF_6$) gas and a helium (He) gas.

The first main etch process may be performed using an etch gas having an etch rate with respect to the silicon layer greater than an etch gas used in the second main etch process.

The first main etch process may be performed using a chlorine ($Cl_2$) gas.

The second main etch process may be performed using one selected from a group consisting of a hexafluoroethane ($C_2F_6$) gas, a tetrafluoromethane ($CF_4$) gas, a sulfur hexafluoride ($SF_6$) gas, and a fluoroform ($CHF_3$) gas.

The over-etch process may be performed using an etch gas having an etch rate with respect to the oxide layer greater than an etch rate with respect to the silicon layer.

The over-etch process may be performed using a $C_2F_6$ gas.

DESCRIPTION OF SPECIFIC EMBODIMENTS

Figure 1A:
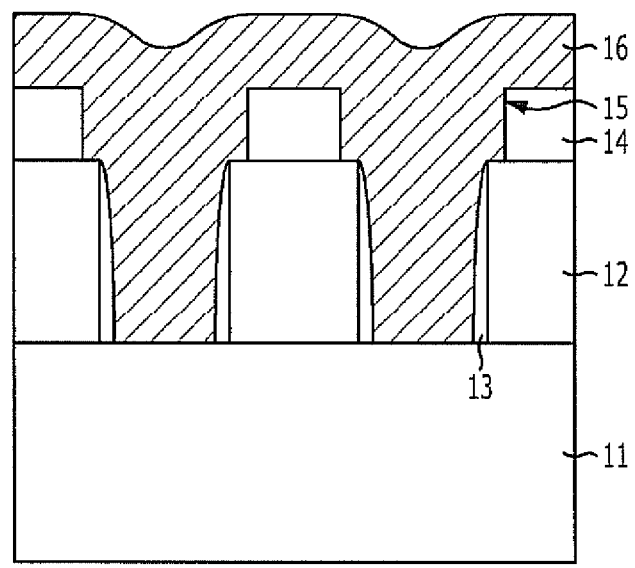
FIGS. 1A and 1B are cross-sectional views illustrating a method for fabricating the conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the prevent invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

The present application provides a method for fabricating a semiconductor device, capable of minimizing a height difference between the upper portions of adjacent landing plugs by isolating the adjacent landing plugs through an etch-back process, including a breakthrough process, a first main etch process, a second main etch process, and an over-etch process.

FIGS. 2A to 2E are cross-sectional views illustrating a method for fabricating a semiconductor device in accordance with an embodiment of the present invention.

Figure 2A:
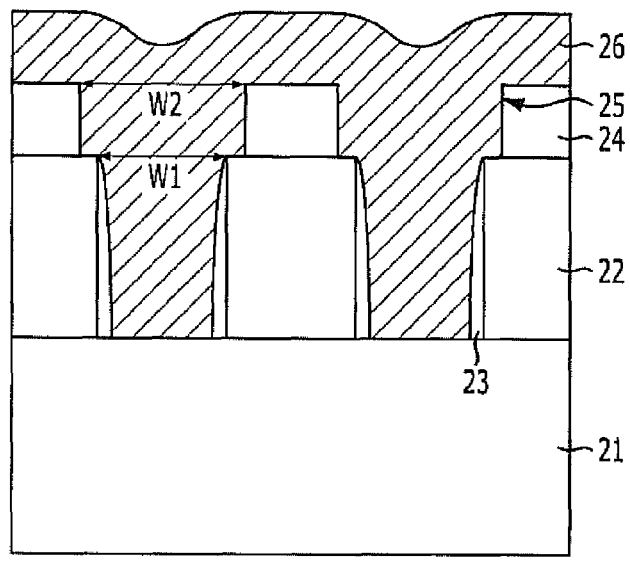
FIGS. 2A to 2E are cross-sectional views illustrating a method for fabricating a semiconductor device in accordance with an embodiment of the present invention.

Referring to FIG. 2A, a plurality of gate patterns 22 are formed over a substrate 21. Although not illustrated, the gate pattern 22 may include a sequentially stacked layer of a gate insulation layer, a gate electrode, and a gate hard mask.

Then, a gate spacer 23 is formed on both sidewalls of the gate patterns 22. The gate spacer 23 may be formed of a nitride layer, such as a silicon nitride ($Si_3N_4$) layer.

Next, an interlayer dielectric layer 24 is formed over a whole upper surface of the substrate 21 to cover the gate pattern 22. The interlayer dielectric layer 24 may include an oxide layer. The oxide layer may include a silicon-oxide ($SiO_2$) layer, a Boron Phosphorus Silicate Glass (BPSG), a Phosphorus Silicate Glass (PSG), a Tetra Ethyle Ortho Silicate (TEOS), an Un-doped Silicate Glass (USG), a Spin On Glass (SOG), a high density plasma oxide layer (HDP), or a Spin On Dielectric (SOD).

A photoresist pattern (not illustrated) is formed over the interlayer dielectric layer 24. Subsequently, a plurality of contact holes 25 are formed by etching the interlayer dielectric layer 24 using the photoresist pattern as an etch barrier layer. At this time, it is preferable that an upper portion of the contact hole 25 has a width 'W2' greater than a gap 'W1' between the gate patterns 22 to increase an overlay margin for forming a bit line contact plug and a landing plug, or a storage node contact plug and the landing plug to be formed in subsequent processes.

Next, the contact hole 25 is filled with a conductive layer 26 for the landing plug. The conductive layer 26 is formed to cover an upper surface of the interlayer dielectric layer 24, and to fill the contact hole 25. The conductive layer 26 may include a silicon (Si) layer. The silicon (Si) layer may include a polysilicon layer or a silicon germanium (SiGe) layer.

Herein, a height difference between upper portions of the conductive layer 26 may be generated during the forming of the conductive layer 26 due to the contact hole 25.

Hereinafter, an etch-back process for minimizing the height difference between the upper portions of the conductive layers 26 for the landing plug by isolating the adjacent conductive layers 26 is described in detail. The etch-back process in this embodiment of the present invention includes a dry etch process using plasma. The etch-back process includes a breakthrough process, a first main etch, a second main etch, and an over-etch process in sequence.

Figure 2B:
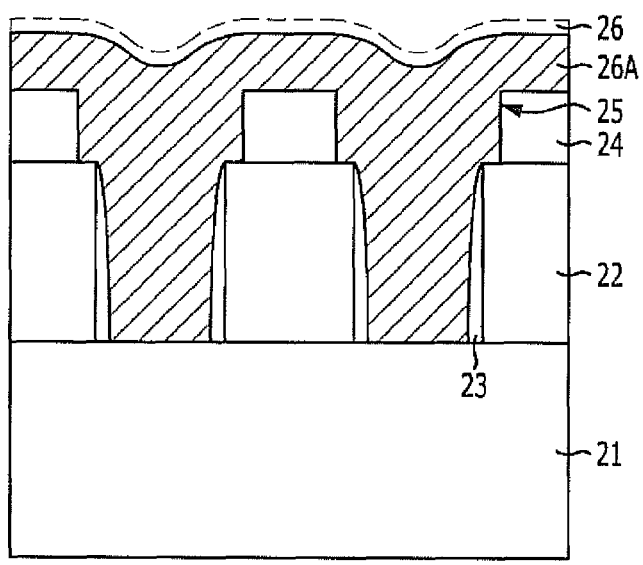

Referring to FIG. 2B, the conductive layer 26 is partially etched. Hereinafter, the etch process for partially etching the conductive layer 26 is referred to as 'the breakthrough process'. At this time, the breakthrough process is usually performed as a pre-treatment process for removing remains and an inherent oxide layer over a surface of an etching target layer before a main etch process, such as the first main etch process, the second main etch process, and the over-etch process. Hereinafter, the conductive layer 26 obtained through the breakthrough process is represented by reference numeral '26A'.

In this embodiment of the present invention, the breakthrough process is performed using an isotropic etch process for removing the remains and the inherent oxide layer on the surface of the conductive layer 26, while reducing a height difference between the upper portions of the conductive layer 26A. At this time, the breakthrough process is performed under a pressure in a range of approximately 8 mTorr to approximately 12 mTorr, a source power in a range of approximately 350 W to approximately 450 W, and a bias power in a range of approximately 0 W to approximately 10 W.

Herein, the breakthrough process is performed under a relatively greater pressure and a relatively lower bias power than those to be used in the subsequent first main etch process, second main etch process, and over-etch process, so that an isotropic etching property of the breakthrough process may be enhanced. The bias power becomes 0W when the bias power is not supplied to a chamber where the breakthrough process is performed. The breakthrough process is performed under a relatively lower source power than those to be used in the subsequent first main etch process, second main etch process, and over-etch process for controlling an etch rate of the conductive layer 26A during the breakthrough process.

Furthermore, the breakthrough process may be performed using a mixed gas of a sulfur hexafluoride ($SF_6$) gas and a rare gas. The rare gas may include a helium (He) gas. The sulfur hexafluoride ($SF_6$) gas may be supplied at flow rates of 8 sccm to 12 sccm. The helium (He) gas may be supplied at flow rates in a range of 180 sccm to 220 sccm.

Herein, the helium (He) gas is used as a diluted gas for controlling a reactivity of the sulfur hexafluoride ($SF_6$) gas, while increasing a production efficiency of plasma. An argon (Ar) gas is usually used as the rare gas during the conventional etch process. The reason why the helium (He) gas, instead of the argon (Ar) gas, is used as the rare gas in this embodiment of the present invention is because the helium (He) gas has an atomic mass smaller than that of the argon (Ar) gas. As a result, the effects of an anisotropic etch, occurring due to a supplied bias power, may be minimized.

The sulfur hexafluoride ($SF_6$) gas is used as a main etch gas to etch the conductive layer 26A. Herein, the etch rate of the conductive layer 26A during the breakthrough process is easily controlled by using the helium (He) gas as the diluted gas with respect to the sulfur hexafluoride ($SF_6$) gas, and using the relatively lower source power than that used in the subsequent first main etch process, second main etch process, and over-etch process.

For reference, the breakthrough process is performed using the isotropic etching process. Thus, if the sulfur hexafluoride ($SF_6$) gas is used as the etch gas without the diluted gas and the same source power as the subsequent first main etch process, second main etch process, and over-etch process is used during the breakthrough process, it is difficult to control the etch process of the breakthrough process.

Figure 2C:
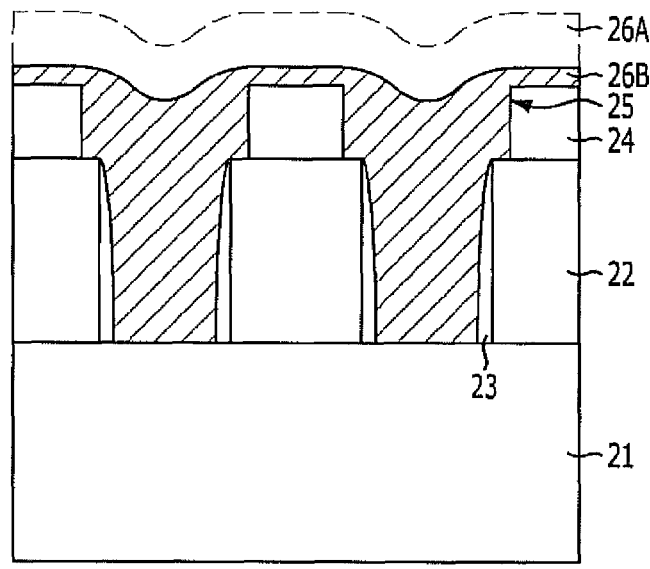

Referring to FIG. 2C, the conductive layer 26A is partially etched. Hereinafter, the etch process for partially etching the conductive layer 26A is referred to as 'the first main etch process'. During the first main etch process, the conductive layer 26A is etched by at least 50% of a total thickness of the conductive layer 26A over the interlayer dielectric layer 24 to form a conductive layer 26B. Preferably, the conductive layer 26A is etched by approximately 60% to approximately 80% of the total thickness of the conductive layer 26A over the interlayer dielectric layer 24 during the first main etch process. That is, for example, the first main etch process is performed to etch the conductive layer 26A by approximately 600 Å to approximately 800 Å where the conductive layer 26A has a total thickness of 1000 Å over the interlayer dielectric layer 24. Therefore, in accordance with the above example, the conductive layer 26B has a thickness in a range of approximately 200 Å to approximately 400 Å as a result of the first main etch process. Hereinafter, the conductive layer 26A obtained through the first main etch process is represented by reference numeral '26B'.

Preferably, the first main etch process is performed using an etch gas, having a greater etch rate with respect to the conductive layer 26B (i.e., the silicon layer) than with respect to the interlayer dielectric layer 24, for effectively removing the conductive layer 26B over the interlayer dielectric layer 24. For example, the first main etch process may be performed using the chlorine ($Cl_2$) gas supplied at flow rates in a range of 60 sccm to 80 sccm.

Furthermore, the first main etch process is performed using an anisotropic etch process. At this time, the first main etch process may be performed under a relatively lower pressure, a relatively greater source power, and a relatively greater bias power than those used in the breakthrough process for enhancing an anisotropic etching property. In particular, the first main etch process may be performed under the pressure in a range of approximately 1 mTorr to approximately 7 mTorr, the source power in a range of approximately 800 W to approximately 900 W, and the bias power in a range of approximately 75 W to approximately 95 W.

For reference, since a mean free path of a molecule of the etch gas is greater as the pressure is lower, the anisotropic etching property is enhanced. The source power generates plasma. Moreover, as the source power increases, a generation rate of the plasma increases. Also, since the bias power accelerates a velocity of a molecule, the etch rate increases as the bias power increases.

Figure 2D:
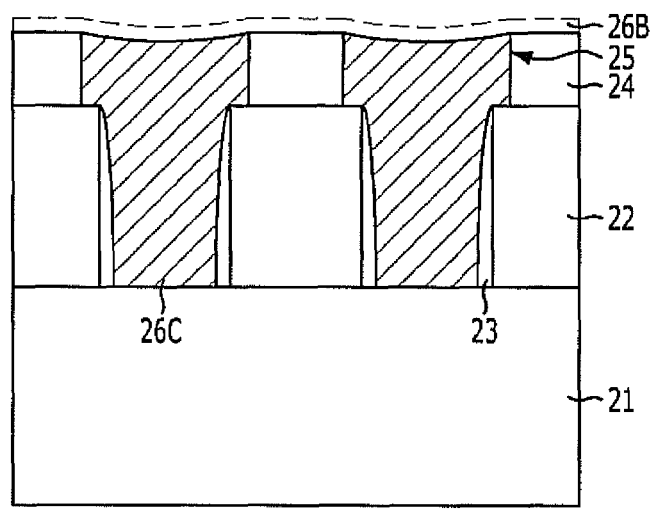

Referring to FIG. 2D, the conductive layer 26B is etched until the upper surface of the interlayer dielectric layer 24 is exposed. Hereinafter, the etch process for etching the conductive layer 26B to expose the upper surface of the interlayer dielectric layer 24 is referred to as 'the second main etch process'. The conductive layer 26B obtained through the second main etch process is represented by reference numeral '26C'.

Preferably, the second main etch process is performed using an etch gas having a slower etch rate with respect to the conductive layer 26B than that used in the first main etch process. Further, the second main etch process removes the remaining conductive layer 26B over the interlayer dielectric layer 24, and at the same time, reduces the height difference between the upper portions of the conductive layer 26B.

Therefore, the second main etch process may be performed using an etch gas, having an etch rate slower than the chlorine ($Cl_2$) gas with respect to the silicon (Si) layer. The etch gas used in the second main etch process is one selected from a group consisting of a hexafluoroethane ($C_2F_6$) gas, a tetrafluoromethane ($CF_4$) gas, a sulfur hexafluoride ($SF_6$) gas, and a fluoroform ($CHF_3$) gas. Further, the etch gas is supplied at flow rates in a range of 70 sccm to 90 sccm. The etch rate of the chlorine ($Cl_2$) gas to the silicon (Si) layer is approximately 26 Å per second. Meanwhile, the etch rate of the hexafluoroethane ($C_2F_6$) gas to the silicon (Si) layer is approximately 13 Å per second.

The second main etch process is performed using an anisotropic etch process, similar to the first main etch process. In particular, the second main etch process is performed under the same pressure and source power as those of the first main etch process. That is, the second main etch process is performed under a pressure in a range of approximately 1 mTorr to approximately 7 mTorr and using a source power in range of approximately 800 W to approximately 900 W.

Since the etch gas used in the second main etch process has a slower etch rate than that in the first main etch process, the method of fabricating a semiconductor requires controlling the etch rate with respect to the conductive layer 26B. Accordingly, the second main etch process may be performed under a relatively greater bias power than that used in the first main etch process. In particular, the second main etch process is performed using the bias power in a range of approximately 100 W to approximately 120 W.

Figure 1B:
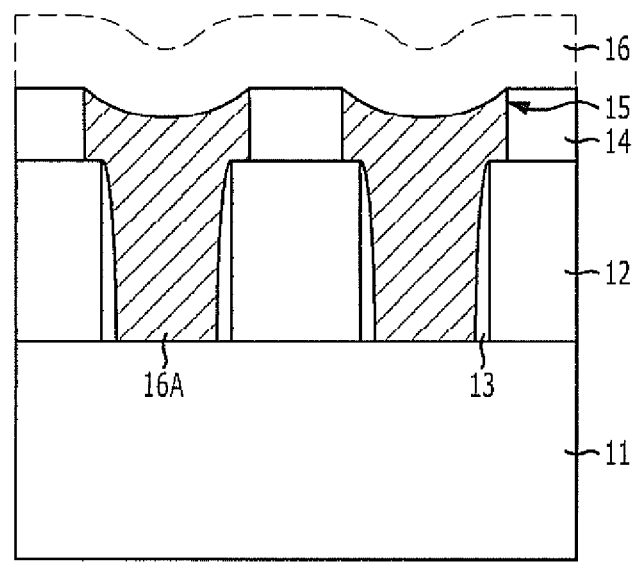

Since chlorine ($Cl_2$) gas is used in the etch-back process to expose the upper surface of the interlayer dielectric layer 14 in the conventional semiconductor, the height difference between the upper portion of the landing plug 16A increases as shown in FIG. 1B.

However, in an embodiment of the present invention, since an etch gas, having an etch rate slower than the etch rate of the chlorine ($Cl_2$) gas, is used during the second main etch process for etching the conductive layer 26B until the interlayer dielectric layer 24 is exposed, the height difference between the upper portions of the conductive layer 26C is smaller than that of the landing plug 16A of the conventional semiconductor.

Figure 2E:
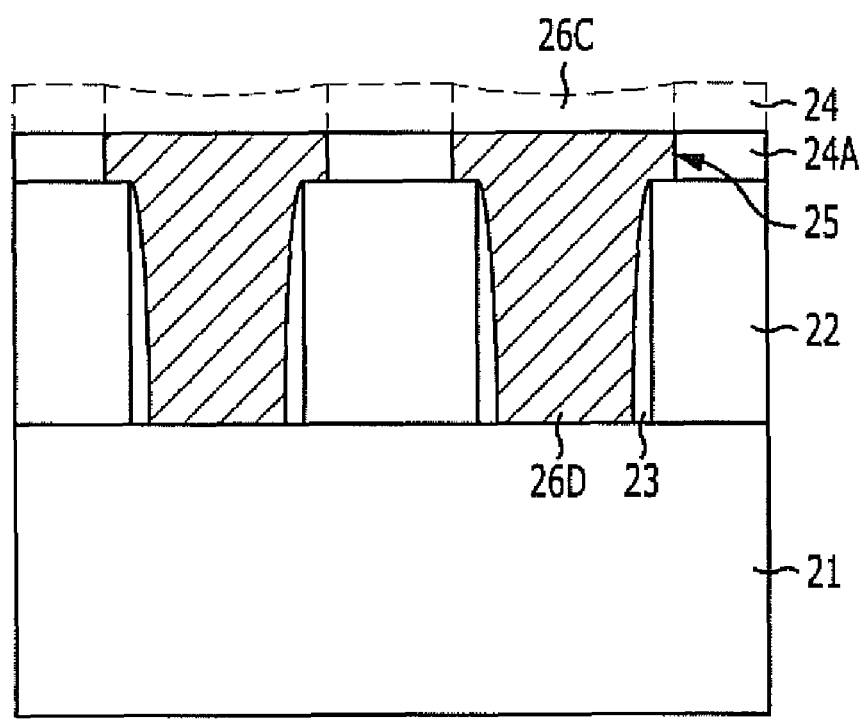

Referring to FIG. 2E, the conductive layer 26C is etched, while etching the interlayer dielectric layer 24. Hereinafter, the etch process for simultaneously etching the conductive layer 26C and the interlayer dielectric layer 24 is referred to as 'the over-etch process'. The interlayer dielectric layer 24 obtained through the over-etch process is represented by reference numeral '24A'. The conductive layer 26C obtained through the over-etch process is referred to as 'a landing plug 26D.'

The over-etch process is performed to completely isolate the adjacent landing plugs 26D using an anisotropic etch process for preventing a short caused by a bridge phenomenon between the remaining conductive layer 26C over the interlayer dielectric layer 24.

Preferably, the over-etch process is performed using an etch gas having an etch rate with respect to the interlayer dielectric layer 24 greater than that with respect to the conductive layer 26C for reducing the height difference of upper portions of the conductive layer 26C.

Therefore, for example, the over-etch process may be performed using the hexafluoroethane ($C_2F_6$) gas having an etch rate with respect to the oxide layer greater than that with respect to the silicon (Si) layer. The hexafluoroethane ($C_2F_6$) gas is supplied at flow rates of approximately 70 sccm to approximately 90 sccm. The etch rate of the hexafluoroethane ($C_2F_6$) gas with respect to the silicon (Si) layer is approximately 13 Å per second, whereas the etch rate of the hexafluoroethane ($C_2F_6$) gas with respect to the oxide layer is approximately 20 Å per second.

Furthermore, the over-etch process is performed under a pressure, a source power, and a bias power equivalent to those used in the second main etch process. That is, the over-etch process is performed under the pressure in a range of approximately 1 mTorr to approximately 7 mTorr, the source power in a range of approximately 800 W to approximately 900 W, and the bias power in a range of approximately 100 W to approximately 120 W.

The breakthrough process, the first and the second main etch processes, and the over-etch process may be performed in-situ in the same chamber.

As described above, the present invention may minimize the height difference between the upper portions of the conductive layer 26 using the breakthrough process as the anisotropic etch process to thereby form the conductive layer 26A. Then the present invention may further minimize the height difference between the upper portions of the conductive layer 26A through the first main etch process to thereby form the conductive layer 26B. Then, the present invention may still further minimize the height difference between the upper portions of the conductive layer 26B through the second main etch process using the etch gas having an etch rate with respect to the conductive layer slower than that used in the first main etch process, to thereby form the conductive layer 26C. Finally, the present invention may again minimize the height difference between the upper portions of the conductive layer 26C for the landing plug through the over-etch process using the etch gas, having an etch rate with respect to the conductive layer greater than the etch rate with respect to the interlayer dielectric layer, to thereby form the landing plug 26D.

As described above, the embodiment of the present invention can minimize the height difference of the landing plug 26D through the etch-back process, including the breakthrough process, the first and the second main etch processes, and the over-etch process in sequence.

In accordance with an embodiment of the present invention, the height difference between the upper portions of adjacent landing plugs can be minimized by isolating the adjacent landing plugs through the etch-back process, including the breakthrough process, the first main etch process, the second main etch process, and the over-etch process.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming an interlayer dielectric layer having a plurality of contact holes over a substrate;
    forming a conductive layer by filling the contact holes to cover the interlayer dielectric layer;
    performing a first main etch process to partially etch the conductive layer to form a first conductive layer;
    performing a second main etch process to etch the first conductive layer using an etch gas having a slower etch rate with respect to the first conductive layer than an etch gas used in the first main etch process until an upper surface of the interlayer dielectric layer is exposed to form a second conductive layer; and
    performing an over-etch process to etch a certain portion of the second conductive layer, and at the same time, to etch a certain portion of the interlayer dielectric layer to form a landing plug.

2. The method of claim 1, further comprising:
    performing a breakthrough process to partially etch the conductive layer to remove remains over the conductive layer before the performing of the first main etch process.

3. The method of claim 2, wherein the breakthrough process, the first and the second main etch processes, and the over-etch process are performed in-situ in the same chamber.

4. The method of claim 2, wherein the breakthrough process is performed using an isotropic etch process, and the first and the second main etch processes and the over-etch process are performed using an anisotropic etch process.

5. The method of claim 2, wherein the breakthrough process is performed at a pressure greater than a pressure used in the first and the second main etch processes and the over-etch process.

6. The method of claim 5, wherein the first and the second main etch processes and the over-etch process are performed under the pressure in a range of approximately 1 mTorr to approximately 7 mTorr.

7. The method of claim 5, wherein the breakthrough process is performed under the pressure in a range of approximately 8 mTorr to approximately 12 mTorr.

8. The method of claim 2, wherein the breakthrough process is performed using a source power smaller than a source power used in the first and the second main etch processes and the over-etch process.

9. The method of claim 8, wherein the first and the second main etch processes and the over-etch process are performed using the source power in a range of approximately 800 W to approximately 900 W.

10. The method of claim 8, wherein the breakthrough process is performed using the source power in a range of approximately 350 W to approximately 450 W.

11. The method of claim 2, wherein the breakthrough process is performed using a bias power smaller than a bias power used in the first main etch process, and the second main etch process and the over-etch process are performed using a bias power greater than a bias power used in the first main etch process.

12. The method of claim 11, wherein the breakthrough process is performed using the bias power in a range of approximately 0 W to approximately 10 W.

13. The method of claim 11, wherein the first main etch process is performed using the bias power in a range of approximately 75 W to approximately 95 W.

14. The method of claim 11, wherein the second main etch process and the over-etch process are performed using the bias power in a range of approximately 100 W to approximately 120 W.

15. The method of claim 2, wherein the breakthrough process is performed under a pressure in a range of approximately 8 mTorr to approximately 12 mTorr, using a source power in a range of approximately 350 W to approximately 450 W, and using a bias power in a range of approximately 0 W to approximately 10 W.

16. The method of claim 1, wherein the first main etch process is performed under a pressure in a range of approximately 1 mTorr to approximately 7 mTorr, using a source power in a range of approximately 800 W to approximately 900 W, and using a bias power in a range of approximately 75 W to approximately 95 W.

17. The method of claim 1, wherein the second main etch process and the over-etch process are performed under a pressure in a range of approximately 1 mTorr to approximately 7 mTorr, using a source power in a range of approximately 800 W to approximately 900 W, and using a bias power in a range of approximately 100 W to approximately 120 W.

18. The method of claim 1, wherein the interlayer dielectric layer includes an oxide layer, and the second conductive layer include a silicon layer.

19. The method of claim 18, wherein the breakthrough process is performed using a mixed gas of a sulfur hexafluoride ($SF_6$) gas and a helium (He) gas.

20. The method of claim 18, wherein the first main etch process is performed using an etch gas having an etch rate with respect to the silicon layer greater than an etch gas used in the second main etch process.

21. The method of claim 20, wherein the first main etch process is performed using a chlorine ($Cl_2$) gas.

22. The method of claim 1, wherein the second main etch process is performed using one selected from a group consisting of a hexafluoroethane ($C_2F_6$) gas, a tetrafluoromethane ($CF_4$) gas, a sulfur hexafluoride ($SF_6$) gas, and a fluoroform ($CHF_3$) gas.

23. The method of claim 18, wherein the over-etch process is performed using an etch gas having an etch rate with respect to the oxide layer greater than an etch rate with respect to the silicon layer.

24. The method of claim 23, wherein the over-etch process is performed using a $C_2F_6$ gas.

* * * * *